US008324661B2

(12) United States Patent
Radosavljevic et al.

(10) Patent No.: US 8,324,661 B2
(45) Date of Patent: Dec. 4, 2012

(54) QUANTUM WELL TRANSISTORS WITH REMOTE COUNTER DOPING

(75) Inventors: Marko Radosavljevic, Portland, OR (US); Gilbert Dewey, Hillsboro, OR (US); Niloy Mukherjee, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 12/646,589

(22) Filed: Dec. 23, 2009

(65) Prior Publication Data

US 2011/0147712 A1 Jun. 23, 2011

(51) Int. Cl.
*H01L 21/338* (2006.01)
*H01L 29/66* (2006.01)
(52) U.S. Cl. ............ 257/192; 257/E21.403; 438/172
(58) Field of Classification Search .......... 257/192, 257/E21.403; 438/172
See application file for complete search history.

(56) References Cited

U.S. PATENT DOCUMENTS

| 5,254,863 | A | * | 10/1993 | Battersby | 257/194 |
|---|---|---|---|---|---|
| 5,329,137 | A | * | 7/1994 | Taylor et al. | 257/21 |
| 5,336,904 | A | * | 8/1994 | Kusunoki | 257/23 |
| 5,343,057 | A | * | 8/1994 | Gerard et al. | 257/192 |
| 2003/0080332 | A1 | * | 5/2003 | Phillips | 257/24 |
| 2004/0135169 | A1 | * | 7/2004 | Yoshii et al. | 257/107 |
| 2005/0173728 | A1 | * | 8/2005 | Saxler | 257/192 |
| 2005/0285098 | A1 | * | 12/2005 | Fathimulla et al. | 257/20 |
| 2008/0142786 | A1 | * | 6/2008 | Datta et al. | 257/24 |
| 2008/0237573 | A1 | * | 10/2008 | Jin et al. | 257/14 |
| 2008/0315216 | A1 | * | 12/2008 | Otsuji et al. | 257/83 |
| 2009/0001350 | A1 | * | 1/2009 | Hudait et al. | 257/14 |
| 2009/0085027 | A1 | * | 4/2009 | Jin et al. | 257/24 |
| 2009/0283756 | A1 | * | 11/2009 | Hellings et al. | 257/24 |
| 2009/0315018 | A1 | * | 12/2009 | Hudait et al. | 257/24 |
| 2009/0315077 | A1 | * | 12/2009 | Chiu et al. | 257/194 |
| 2010/0102358 | A1 | * | 4/2010 | Lanzieri et al. | 257/194 |
| 2010/0155701 | A1 | * | 6/2010 | Radosavljevic et al. | 257/24 |
| 2010/0163849 | A1 | * | 7/2010 | Radosavlijevic et al. | 257/24 |
| 2010/0163927 | A1 | * | 7/2010 | Pillarisetty et al. | 257/194 |
| 2010/0224861 | A1 | * | 9/2010 | Jain et al. | 257/20 |

* cited by examiner

*Primary Examiner* — Kiesha Bryant
*Assistant Examiner* — Igwe U Anya
(74) *Attorney, Agent, or Firm* — Blakely, Sokoloff, Taylor & Zafman LLP

(57) ABSTRACT

A quantum well device and a method for manufacturing the same are disclosed. In an embodiment, a quantum well structure comprises a quantum well region overlying a substrate and a remote counter doping comprising dopants of conductivity opposite to the conductivity of the charge carriers of the quantum well region. The remote counter doping is incorporated in a vicinity of the quantum well region for exchange mobile carriers with the quantum well channel, reducing the off-state leakage current. In another embodiment, a quantum well device comprises a quantum well structure including a remote counter doping, a gate region overlying a portion of the quantum well structure, and a source and drain region adjacent to the gate region. The quantum well device can also comprise a remote delta doping comprising dopants of the same conductivity as the quantum well channel.

20 Claims, 15 Drawing Sheets

QUANTUM WELL TRANSISTORS WITH REMOTE COUNTER DOPING

FIELD OF THE INVENTION

The present invention relates to a heterostructure manufacturing method and device and, more particularly, to the nanofabrication of heterostructure devices.

BACKGROUND

Continued physical scaling of mainstream silicon CMOS (complementary metal oxide semiconductor) technology has boosted the performance of the silicon devices in the last 40 years. A future direction could be the introduction of new channel materials with higher carrier mobility such as III-V compound semiconductors such as InSb, InAs, and InGaAs, which are very promising materials for high-speed and lower power computation applications. III-V materials in general have 50-100 times higher electron mobility than Si, and III-V quantum well field effect transistors present attractive merits over scaled Si transistors. Quantum well field effect transistors utilizing III-V materials have shown promise as an ultra-fast, very low power digital logic technology with their high electron mobility and saturation velocity.

Conventional quantum well devices are characterized by employing a narrow band gap quantum well layer sandwiched between two wide band gap barrier layers. The wide band gap barrier layers serve to confine carriers in the narrow band gap quantum well layer, and to reduce junction leakage and transistor off-state leakage current. In a quantum well, electrons and holes are free to move in 2-dimensions, and thus show distinctly different characteristics than in 3-dimensional silicon transistors. FIG. 1 illustrates a prior art quantum well transistor, comprising quantum well channel 15 located between source 13S and drain 13D, and controlled by gate 10. The quantum well channel is typically a low bandgap material, sandwiched between barrier layers 14 and 16 of higher bandgap material. The quantum well structure is fabricated on substrate 19. An optional buffer layer 18 can be formed between the substrate 19 and the quantum well structure for lattice matching.

However, today quantum well transistors are prone to high gate leakage and parasitic series resistance, especially for sub-micron devices with low operating voltage. There are few design improvements for III-V devices to reduce off-state leakage, perhaps due to the small number of transistors in integrated circuit, where high leakage current does not significantly affect the power requirement.

In contrast, silicon devices is fabricated in VLSI (very large scale integration) and even ULSI (ultra large scale integration), and thus designs with minimum off-state leakage current are required to provide reasonable power consumption. In addition, continual scaling of transistor devices also increases short channel effects, including an increased off-state drain to source leakage current, for example, in drain-induced-barrier-lowering and punch-through. Further, low operating voltage generally leads to low threshold voltage, which can lead to high off state leakage, which is the leakage current that occurs when the transistor is turned off.

One reliable and most likely used technique for preventing short channel effects in silicon field effect transistors is halo implants, which are generally known for their ability to stop unwanted source/drain leakage conduction, or punchthrough current. The halo architecture creates a localized dopant distribution near the source/drain regions and extends under the channel. FIG. 2 illustrates a prior art silicon channel transistor with halo implants, comprising source 23S, drain 23D, gate electrode 20 and gate dielectric 22 fabricated on substrate 29, together with source/drain extension 28S/28D and gate spacer 21. Angled implantation 27 forms pockets of halo implants 25, served to shape the distribution of the source and drain dopants, and thus controlling the leakage current in off-state.

DETAILED DESCRIPTION OF THE PREFERRED EMBODIMENTS

Figure 1:
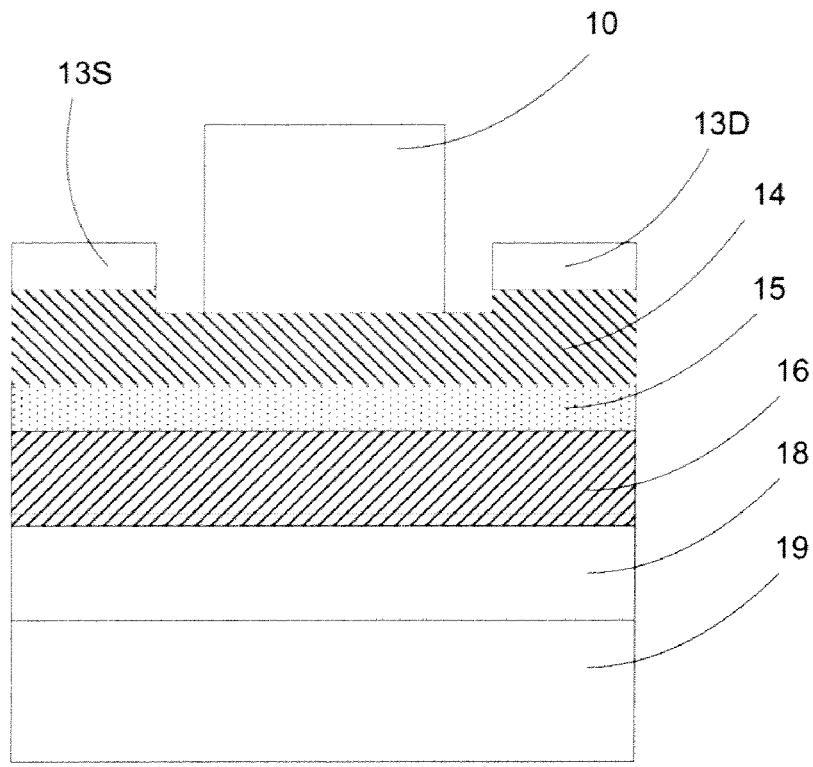
FIG. 1 illustrates a prior art quantum well transistor.
Figure 2:
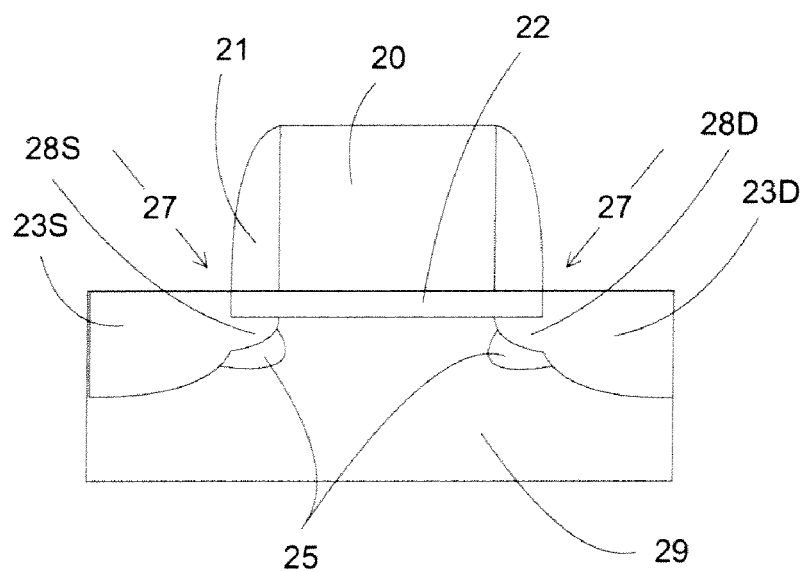
FIG. 2 illustrates a prior art silicon channel transistor with halo implants.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Various operations will be described as multiple discrete operations, in turn, in a manner that is most helpful in understanding the present invention. However, the order of the description should be construed to imply that these operations are not necessarily order dependent. In particular, these operations need not be performed in the order of presentation.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive.

Embodiments of the present invention disclose scalable quantum well structures, quantum well devices, and methods of manufacturing the same. In an embodiment, the quantum well structure comprises a remote counter doping region in a vicinity of the quantum well. The dopants of the remote counter doping have opposite conductivity type as compared to the conductivity of the charge carriers in the quantum well. For example, for a p-type quantum structure, i.e., a quantum well structure having a p-channel quantum well, the remote counter doping comprises n-type dopants. For n-type quantum well structures, the remote counter doping comprises p-type dopants.

In an embodiment, the remote counter doping is disposed in close proximity of the quantum well channel to exchange mobile charges with the quantum well channel. For example, the remote counter doping is disposed less than 10 nm from the quantum well channel. In an embodiment, the remote counter doping is disposed less than 5 nm from the quantum well channel. The remote counter doping can be disposed above the quantum well channel, e.g., near the gate electrode, or below the quantum well channel, e.g., near the substrate. In an embodiment, the remote counter doping can form a channel along the quantum well channel, or can form any other shapes, such as pocket doping regions near the source or the drain.

In an embodiment, the concentration of the remote counter doping is selected to achieve a desired performance for the quantum well structure, such as meeting a desired power consumption or achieving a desired level of mobile charge exchange with the quantum well channel. In an embodiment, the doping concentration of the remote counter doping is less than $10^{18}/cm^3$. In another embodiment, the doping concentration of the remote counter doping is between $10^{16}$ and $10^{18}/cm^3$. In general, the concentration and the distance to the quantum well channel are related parameters, thus in other embodiments of the present invention, concentration levels outside the range of $10^{16}$ to $10^{18}/cm^3$ and distance to the quantum well channel outside the range of 10 nm can be considered. For example, a low doping concentration of high $10^{15}/cm^3$ can be used for a close proximity such as 4-5 nm to the quantum well channel.

In an embodiment, the remote counter doping can be deposited or grown in the area near the quantum well channel. For example, a remote counter doping layer can be deposited on a substrate before or after depositing a quantum well channel layer. In another embodiment, the remote counter doping can be ion implanting to a region near the quantum well channel.

In an embodiment, other conditions of the remote counter doping, such as the dopant species and the process and treatment of the remote counter doping to achieve a desired dopant distribution, are provided to achieve a desired performance for the quantum well structure. In an embodiment, the remote counter doping can enable scalability and higher performance as scattering will be suppressed with impurities being outside the quantum well.

In embodiments of the present invention, the quantum well structure comprises a heterojunction of a narrow bandgap channel material and a layer of larger bandgap material wherein the narrow bandgap channel conducts charge carriers of a first conductivity. In an embodiment, the remote counter doping is incorporated in the layer of the larger bandgap material, and comprises dopants of a second conductivity opposite to the first conductivity.

In silicon CMOS devices, to allow conduction, semiconductors need to be doped with impurities to generate mobile charges. However, impurity collision causes the charges to slow down, reducing the operating speed of the device. Quantum well devices avoid this problem by using high mobility charges generated using a heterojunction of a doped wide-bandgap barrier layer (e.g. AlGaAs) and a non-doped (intrinsic) narrow-bandgap channel layer (e.g. GaAs). In n-channel devices, the wide-bandgap barrier layer is doped with n-type dopants, and the electrons generated in the doped n-type wide-bandgap barrier layer inject completely into the narrow-bandgap channel layer, because of the quantum well formed by the heterojunction created by different bandgap materials. Thus the electrons in the quantum well can move quickly without colliding with any impurities. The effect of this quantum well structure is a very thin layer of highly mobile conducting electrons with very high concentration, giving the channel low resistivity (or high electron mobility). Similarly, in p-channel quantum well structure, the wide-bandgap barrier layer is doped with p-type dopants, and the charge carriers are highly mobile conducting holes.

In embodiments of the present invention, the quantum well structure comprises a narrow bandgap channel material sandwiched between layers of larger bandgap materials wherein the narrow bandgap channel conducts charge carriers of a first conductivity. The remote counter doping can be incorporated in at least one of the layer of the larger bandgap materials, and comprises dopants of a second conductivity opposite to the first conductivity. In an embodiment, the remote counter doping is incorporated in the bottom of the larger bandgap layers. In another embodiment, the remote counter doping is incorporated in the top layer or in both the top and the bottom layer of the larger bandgap layers.

In an embodiment, the quantum well structure comprises III-V compound semiconductor materials, such as InSb, InGaAs, and InAs for the narrow bandgap quantum well channel layers, and InAlSb, InP, InAlAs, and InGaAsP for the wide bandgap barrier layers. III-V compound semiconductors are commonly used for quantum well structures, such as GaAs (narrow bandgap quantum well channel) with AlGaAs (wide bandgap barrier layer) and InSb (narrow bandgap quantum well channel) with AlInSb (wide bandgap barrier layer), though there are wide variations, dependent on the application of the device.

The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors include, but are not limited to alloys of GaAs, InP, InSb, InGaAs, AlGaAs, InAlAs, InAlAsSb, InAlAsP and InGaAsP.

The term "bandgap" refers to the energy difference between the top of the valence band and the bottom of the conduction band. In an embodiment, a wide band gap material has an electronic band gap larger than 1 eV or larger than 2 eV. In an embodiment, a narrow band gap material has an electronic band gap smaller than 1 eV or smaller than 0.6 eV.

In other embodiments, the quantum well structures have a relative bandgap difference of 0.2 to 2 eV.

In embodiments of the present invention, the quantum well structure also comprises a remote delta doping in a vicinity of the narrow-bandgap quantum well channel layer. In an embodiment, the remote delta doping is incorporated in addition to the doped wide-bandgap barrier layer. The remote delta doping is doped with the same conductivity type as the doped wide-bandgap barrier layer, and can supply mobile charges to the quantum well channel, enhancing the conduction of the quantum well channel. In an embodiment, the remote delta doping layer is incorporated in a side of the quantum well, opposite the remote counter doping layer.

Embodiments of the present invention disclose heterostructure devices and manufacturing methods that provide for fabrication of heterostructure devices including quantum well structures. These heterostructure devices may be used for semiconductor heterojunction field-effect transistors with a wide range of applications, including low power, high frequency processing and communications. In an embodiment, the heterostructure device is formed from a suitable substrate having a quantum well formed therein, together with a remote counter doping located in a close proximity of the quantum well. The quantum well structure comprises a first conductivity type quantum well channel, and the remote counter doping comprises dopant of a second conductivity, opposite to the first conductivity. In an embodiment, the quantum well structure comprises a narrow bandgap channel material sandwiched between layers of larger bandgap materials wherein the narrow bandgap channel conducts charges of a first conductivity. The heterostructure device further comprises a remote counter doping incorporated in at least one of the layers of the larger bandgap materials, wherein the remote counter doping comprises dopants of a second conductivity opposite the first conductivity. The remote counter doping can significantly reduce the leakage current in off-state with little effect on the conduction current in on-state of the quantum channel.

A quantum well transistor in accordance with an embodiment of the present invention comprises the above-described quantum well structure, which comprises a first-conductivity quantum well channel and a remote counter doping in a vicinity of the quantum well channel with the remote counter doping comprising dopants of a second conductivity opposite the first conductivity. The quantum well transistor further comprises agate electrode disposed in a vicinity of the quantum well channel so that a voltage applied to the gate electrode can control the conductivity of the quantum well channel. The quantum well transistor also comprises a source and a drain suitable for forming a conduction channel when the quantum well device is in operation. The quantum well transistor can be fabricated on a substrate, with or without a buffer layer to reduce lattice mismatch between the substrate and the quantum well structure. Accordingly, in various embodiments, n-channel or p-channel quantum well transistors having high speed and low power consumption can be formed.

Figure 3:
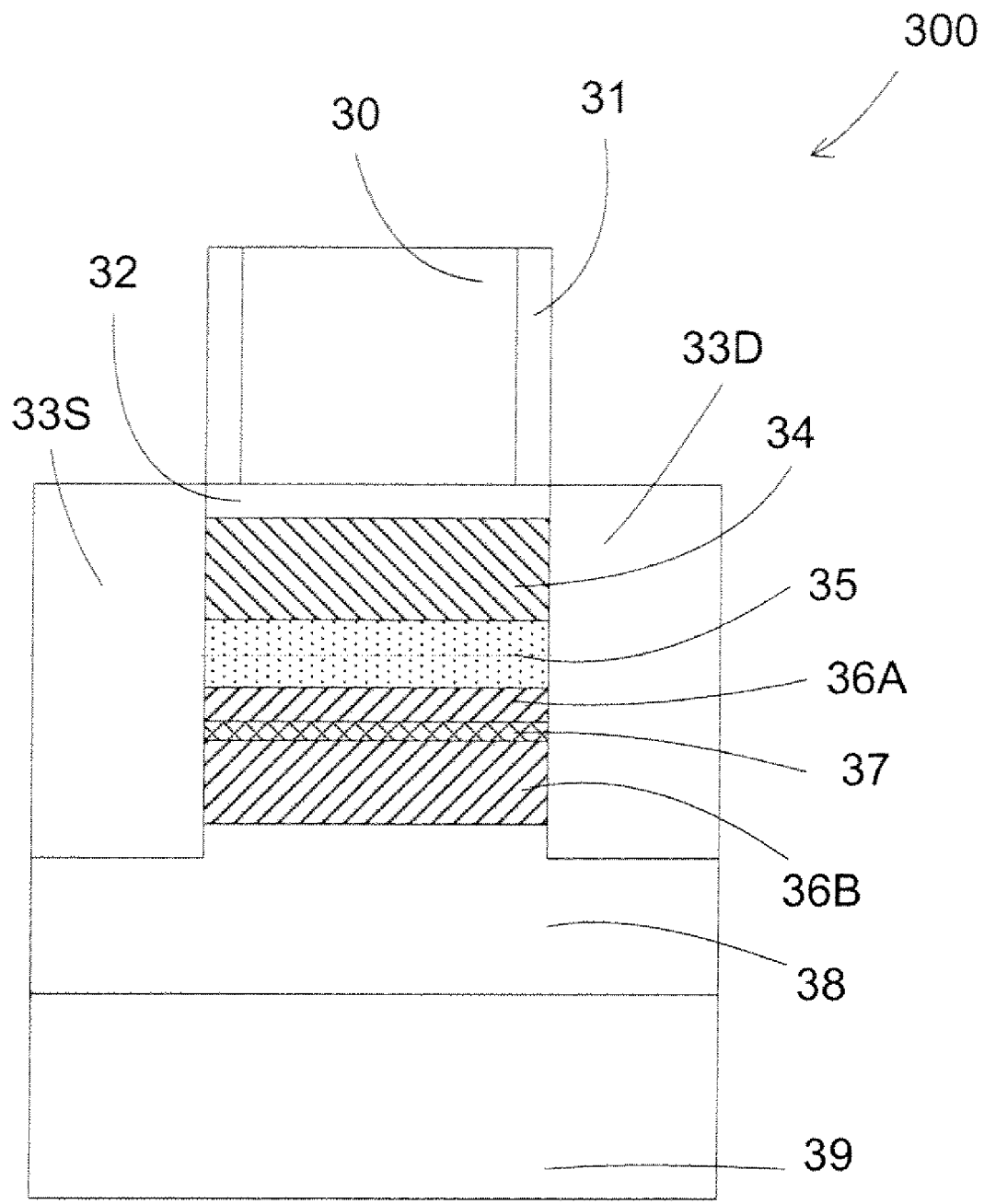
FIG. 3 illustrates an exemplary quantum well field effect transistor according to an embodiment of the present invention.

FIG. 3 illustrates an exemplary quantum well field effect transistor 300 in accordance to an embodiment of the present invention. The quantum well transistor 300 comprises a quantum well structure comprising a low bandgap quantum channel 35 sandwiched between high bandgap barrier layer 34 at the top and high bandgap barrier layers 36A/36B at the bottom. A remote counter doping layer 37 is disposed near the quantum well channel 35. In an embodiment, the incorporation of the remote counter doping layer is designed to achieve a desired performance of the quantum well device, such as low off-state leakage current, for example, less than 100 nA/μm.

The dopants of the remote counter doping layer 37 have opposite conductivity type as compared to the conductivity of the charge carriers in the quantum well channel layer 35. For example, for an n-type quantum well channel, e.g., an intrinsic channel layer 35 sandwiched between n-type doped barrier layers 34 or 36A/36B, the conductivity of the quantum well channel is n-type, and the remote counter doping comprises p-type dopants. For p-type quantum well structures, the remote counter doping comprises n-type dopants.

In an embodiment, the remote counter doping layer 37 is disposed in close proximity of the quantum well channel 35 to exchange mobile charges with the quantum well channel. As shown, the remote counter doping layer 37 is disposed below the quantum well channel 35, near the substrate 39. Alternatively, the remote counter doping layer 37 can be disposed above the quantum well channel 35 near the gate electrode 30 (not shown). Also, another remote counter doping layer can be disposed above the quantum well channel 35, in addition to the remote counter doping layer 37.

Further, the remote counter doping layer 37 forms a layer along the quantum well channel 35. In an embodiment, the remote counter doping can form any other shapes, such as pocket doping regions near the source or the drain (not shown).

In an embodiment, the conditions of the remote counter doping are selected to improve a performance for the quantum well transistor, such as reducing an off-state leakage current. For example, the proximity and the doping level of the remote counter doping layer 37 can be optimized for different performance requirements. In an embodiment, the doping level of the remote counter doping is between $10^{16}$ and $10^{18}/cm^3$, and the distance to the channel layer 35 is less than 5 nm. In another embodiment, a doping level for the remote counter doping layer is chosen, and the distance is then optimized to achieve a desired performance. In yet another embodiment, a distance to the quantum channel layer 35 is chosen, and the doping level for the remote counter doping layer is then optimized to achieve a desired performance.

Embodiments of the present invention also include the fabrication processes for the remote counter doping layer. In an embodiment, the remote counter doping can be deposited or grown in the area near the quantum well channel. For example, a lower high bandgap barrier layer 36B is deposited on a buffer layer 38. Then a remote counter doping layer 37 is deposited or grown on the lower barrier layer 36B. An upper barrier layer 36A is then deposited on the remote counter doping layer 37 before depositing the channel layer 35. Alternatively, the remote counter doping layer can be deposited or grown above the channel layer 35, for example, in the top barrier layer 34.

In another embodiment, the remote counter doping can be ion implanting to a region near the quantum well channel. For example, high bandgap barrier layers 36A and 36B are deposited on buffer layer 38. Remote counter doping layer 37 is then implanted to a region within the two barrier layers 36A and 36B. For n-type dopants, doping may be implemented using elements in column IV or VI, such as tellurium (Te), silicon (Si) or sulfur (S). As for p-type dopants, doping may be elements in column II or IV, such as beryllium (Be) or carbon (C).

In embodiments of the present invention, the quantum well structure, comprising the quantum well channel 35 and the barrier layers 34 and 36A/36B, comprises III-V compound semiconductor materials. In an embodiment, the quantum well channel layer 35 comprises materials having lower bandgap than the materials of the barrier layers 34 and 36A/36B. For example, the channel materials can be selected from InSb, GaAs, InGaAs, and InAs and the barrier materials can be selected from AlInSb, AlGaAs, InGaAsP, AlInAs, and InP. The top and bottom barrier layers 34 and 36A/36B can be the same material or can be different materials.

In an embodiment, the materials selected for the quantum well structure is selected to provide a large difference in bandgap, which creates band discontinuities at the interface between the two semiconducting materials. These discontinuities are referred to as the conduction and valence band offsets. For n-channel quantum well, the conduction band offset can form a potential well confining electrons in a two-dimensional plane parallel to the heterointerface. For example, InGaAs/InAlAs quantum well structure has a conduction band offset and a valance band offset of 0.5 eV and 0.2 eV respectively. In an embodiment, the quantum well device comprises nitride semiconductor materials such as GaN/AlGaN quantum well structure. In other embodiments, the quantum well device comprises heterostructure bipolar transistor, for example, using InP/GaInAs or InP/GaAsSb/InP quantum well structure.

The barrier layers may confine the carriers and reduce remote ion scattering. In an embodiment, the thickness of the top barrier layer 34 is between 5-50 nm, and may be a Schottky barrier layer for gate control. The bottom barrier layer 36A/36B may be as thin as about 10-25 nm, may be as thick as about 2-5 microns, or may be any thickness in between. Quantum well layer 35 may be of sufficient thickness to provide adequate channel conductance. In some embodiments, quantum well layer 35 can be about 10-50 nm. Quantum well layer 35 may provide high electron mobility and velocity for n-channel devices, or high hole mobility and velocity for p-channel devices. Strain materials can also be used to fabricate the quantum well structures. The barrier layer can also comprise one or multiple layers.

In an embodiment, barrier layers 34 and 36A/36B comprise materials with similar lattice constant to the channel layer to accommodate lattice mismatch. For example, if the channel 35 is made from InSb, then both the barrier layers 34 and 36A/36B are preferably made of AlInSb. If the channel 35 is made from InAs, then both the barrier layers 34 and 36A/36B are preferably made of InAlAs. The high bandgap barrier layers 34 and 36A/36B can also provide electrical isolation for the quantum well channel.

The above quantum well structure is formed on a buffer layer 38 on a substrate 39. The substrate 39 can be silicon, GaAs or any other substrate materials. The buffer layer 38 is chosen to provide a transition of lattice from the substrate to the quantum well structure. Buffer layers are typically used to relieve the strain induced by the lattice mismatch between a substrate and the III-V device layer and thereby reduce the detrimental defect density of the device layer. Buffer layer 38 can be a single layer, multiple layers, or a layer with gradually changed lattice constant. Alternatively, bottom barrier layers 36A/36B can act as buffer layer 38. Buffer layer 38 may be formed via an ultra-high vacuum chemical vapor deposition (UHVCVD), reduced pressure chemical vapor deposition (RPCVD), or other processes such as molecular beam epitaxy (MBE).

Source 33S and drain 33D are disposed on both sides of the quantum well channel 35. The source 33S and drain 33D can be fabricated by doping the regions with appropriate dopants. In an embodiment, the structure of the source 33S and the drain 33D still comprise the quantum well structure, but with additional dopants to establish the source and drain regions.

In another embodiment, the source and drain regions are etched away, and re-deposited with appropriate source/drain materials. Raised source and drain structure can be used.

Gate 30, preferably a metal gate, is disposed on the channel 35 to control the conduction of the charges through the channel 35. Optionally, the device can comprise gate dielectric 32 between the gate 30 and the channel 35, and spacers 31 to insulate the gate 30 from the source and drain. Alternatively, the top barrier layer 34 can be a Schottky barrier layer for gate control.

The exemplary device can be used for enhancement mode (i.e., normally "off") or depletion mode (i.e., normally "on") devices. In enhancement mode, the upper barrier layer 34 may be thinner. In an embodiment, the fabrication of the quantum well device can use processes already known in the semiconductor manufacturing art, such as conventional CMOS processing to complete a gate stack or to fabricate the remainder of the quantum well device.

Figure 4:
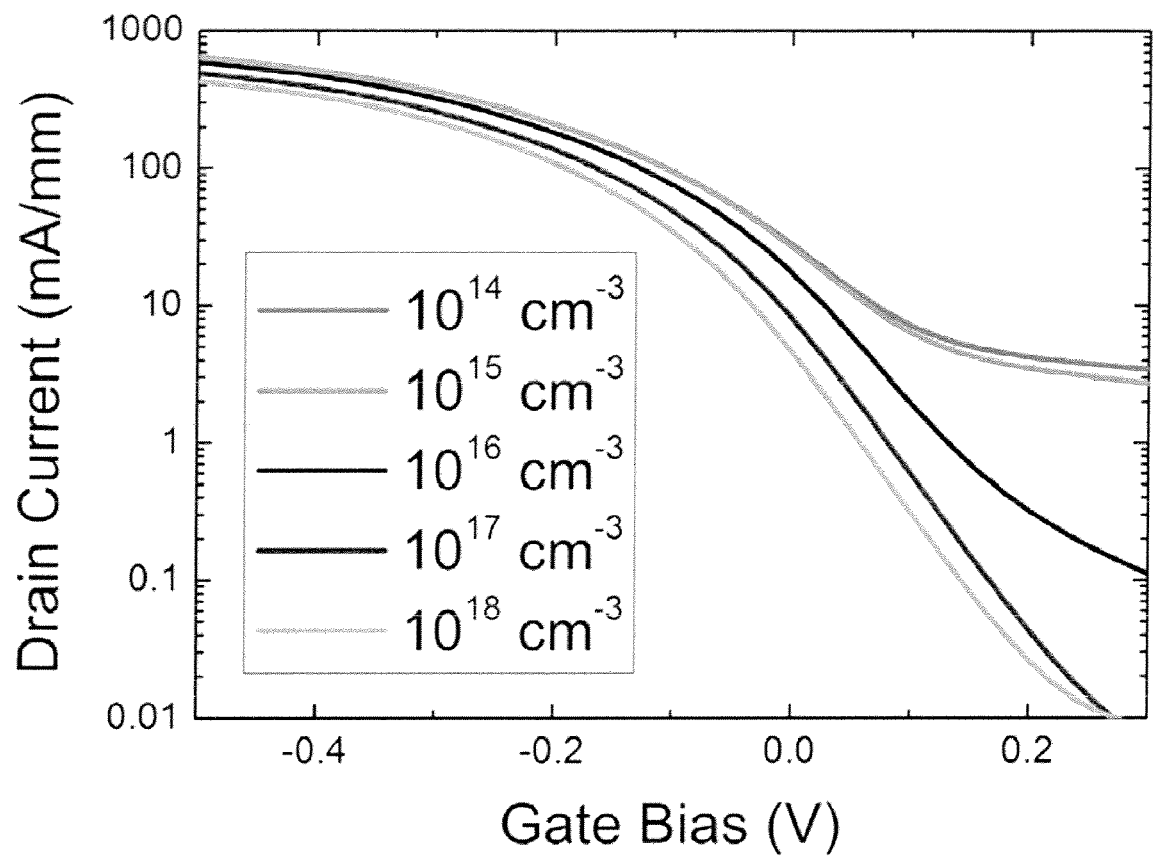
FIG. 4 illustrates simulation data for an exemplary quantum well device according to an embodiment of the present invention.

FIG. 4 illustrates simulation data for an exemplary quantum well device according to an embodiment of the present invention, showing the drain current as a function of the gate bias for different remote counter doping concentration. For p-channel transistor, the device turns on at negative gate bias and turns off at positive gate bias. As shown, on-state current of 500-600 mA/mm is achieved for gate bias less than −0.4V. Higher remote counter doping concentration shows a slight reduction in conduction current for on-state, about 20-30% reduction in increasing the concentration from $10^{14}$ to $10^{18}$/cm$^3$. In contrast, the off-state current (the drain current when the device is not conducting, at positive gate bias voltage) is from 3 mA/mm to 0.01 mA/mm for gate bias greater than 0.2 V. Higher remote counter doping concentration shows a significant reduction in conduction current for off-state, about 300-350 times (as compared to 20-30%) reduction in increasing the concentration from $10^{14}$ to $10^{18}$/cm$^3$. In general, there is little difference in doping concentration between $10^{14}$ and $10^{15}$/cm$^3$ and between $10^{17}$ and $10^{18}$/cm$^3$. The data represents certain assumptions of the quantum well transistor in incorporating the present remote counter doping, and not necessarily reflecting conditions of an optimized device. Thus better performance can be expected with careful experimentation, for example, a smaller reduction in on-state current, or even an elimination of the reduction of on-state current, together with a larger reduction in off-state current.

In any case, the data shows a fundamental result for the incorporation of the remote counter doping according to an embodiment of the present invention, namely a significantly reduction of off-state leakage current in quantum well transistor. As shown, there can be two to three orders of magnitude reduction of off state leakage current with the incorporation of remote counter doping.

Figure 5:
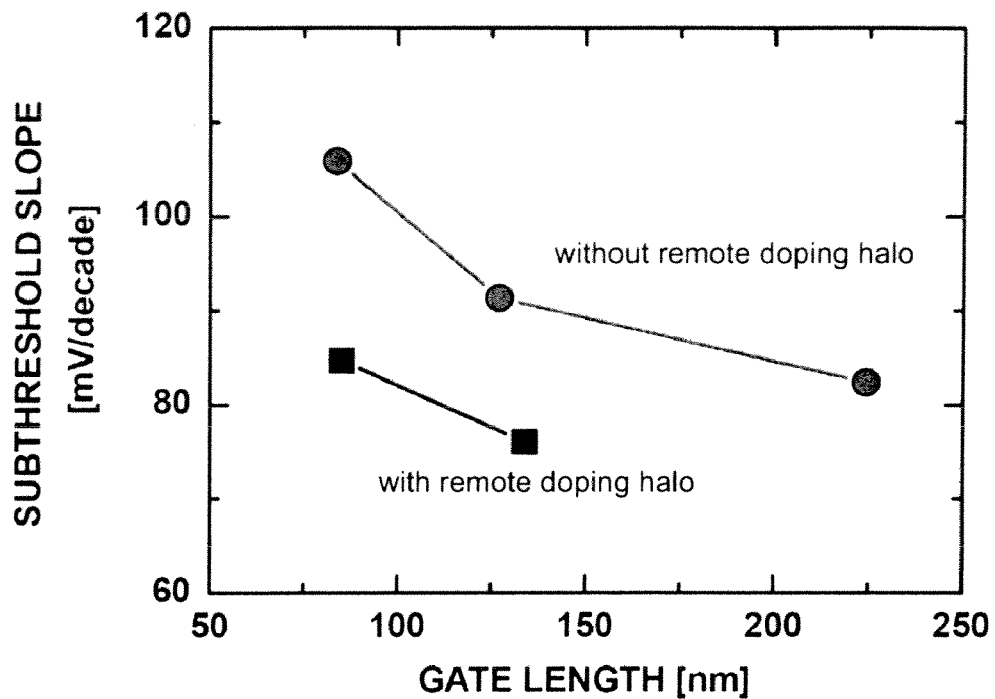
FIGS. 5 and 6 illustrate data on subthreshold slope and DIBL as a function of gate length for an n-channel device according to an embodiment of the present invention.
Figure 6:
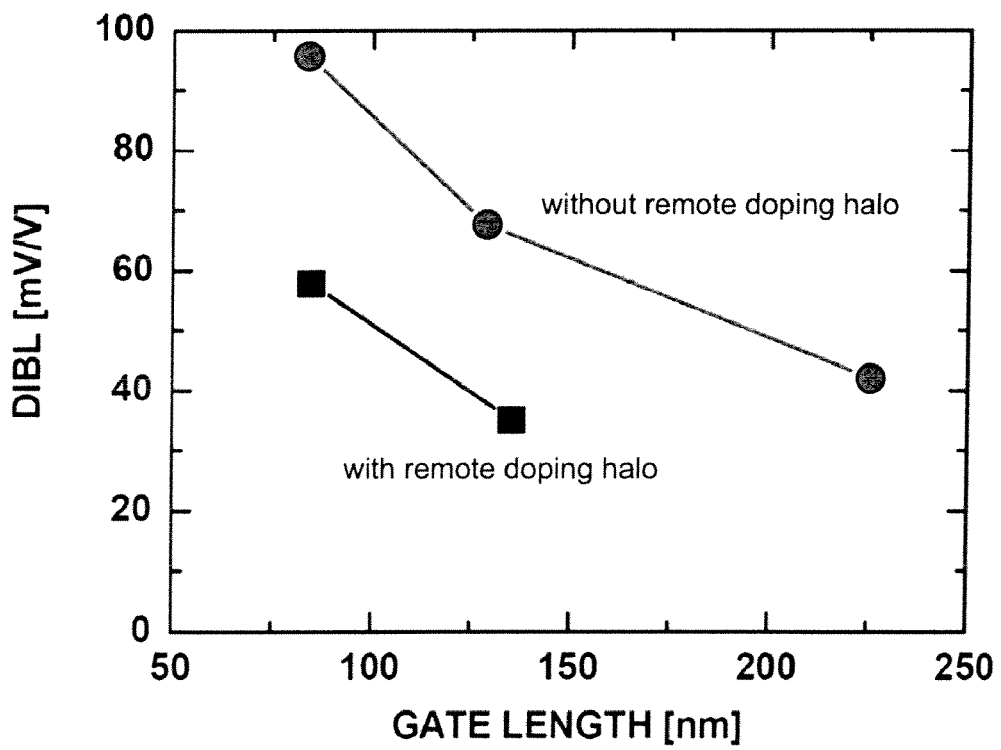

FIGS. 5 and 6 illustrate data on subthreshold slope and DIBL as a function of gate length for an exemplary n-channel quantum well device according to an embodiment of the present invention. The data show a measure of the overall electrostatic integrity of the exemplary quantum well device according to an embodiment of the present invention. DIBL (drain induced barrier lowering) and subthreshold slope are characteristics of short channel effects, with DIBL being a measure of the change in the threshold voltage of the device as a result of change in $V_{DS}$. Small DIBL values reflect a good threshold voltage stability to manufacturing variations. In comparison of devices with and without remote counter doping, DIBL and subthreshold slope are significantly improved for the structures with smaller gate length.

Figure 7A:
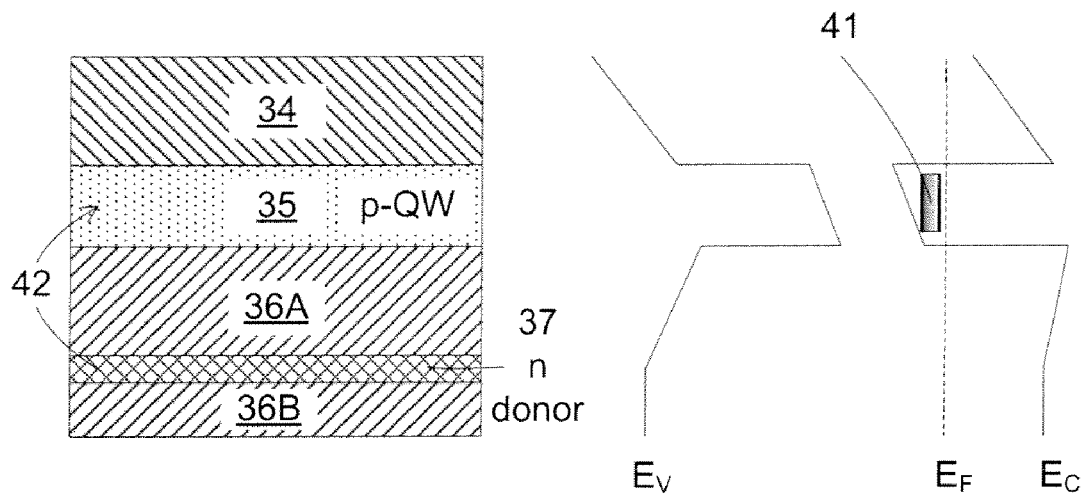
FIGS. 7A and 7B illustrate a band diagram of a p-type quantum well structure in accordance with an embodiment of the present invention.
Figure 7B:
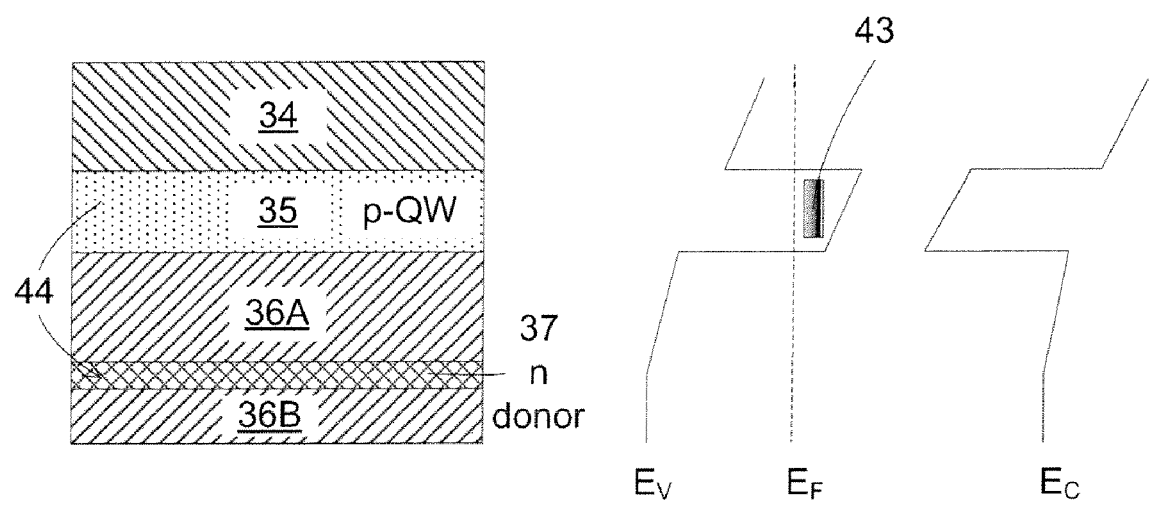

FIGS. 7A and 7B illustrate a band diagram of a p-type quantum well structure in accordance with an embodiment of the present invention. The band diagrams show a layman interpretation of the effect and behavior of the remote counter doping layer to the present quantum well structure, and are intended as a hypothesis for a model of the present remote counter doping, and should not affect the validity of the present invention.

FIG. 7A shows the band diagram for off-state quantum well channel and FIG. 7B shows the band diagram for on-state quantum well channel. The two lines represent the conduction band ($E_C$) and the valence band ($E_V$), with the separation between these lines representing the bandgap. As shown, the quantum well channel 35 has a smaller bandgap than the barrier layers 34 and 36A/36B. The remote counter doping layer 37 incorporates in the bottom barrier layer, separating the bottom barrier into an upper bottom barrier layer 36A and a lower bottom barrier layer 36B, and introduces a change in the direction of the band diagram.

For off-state (FIG. 7A), the Fermi level ($E_F$) is near the conduction band $E_C$. N-type donors in the remote counter doping layer 37 inject electrons into the quantum well, located at 41 below the Fermi level. The electrons in the quantum well provide additional barrier to the conduction current, and thus significantly reduce the leakage current in off-state.

For on-state (FIG. 7B), the Fermi level $E_F$ is near the valence band $E_V$. Holes from the quantum well channel jump to the remote counter doping layer, located at 43 above the Fermi level, somewhat affecting the conduction current in on-state.

Figure 8:
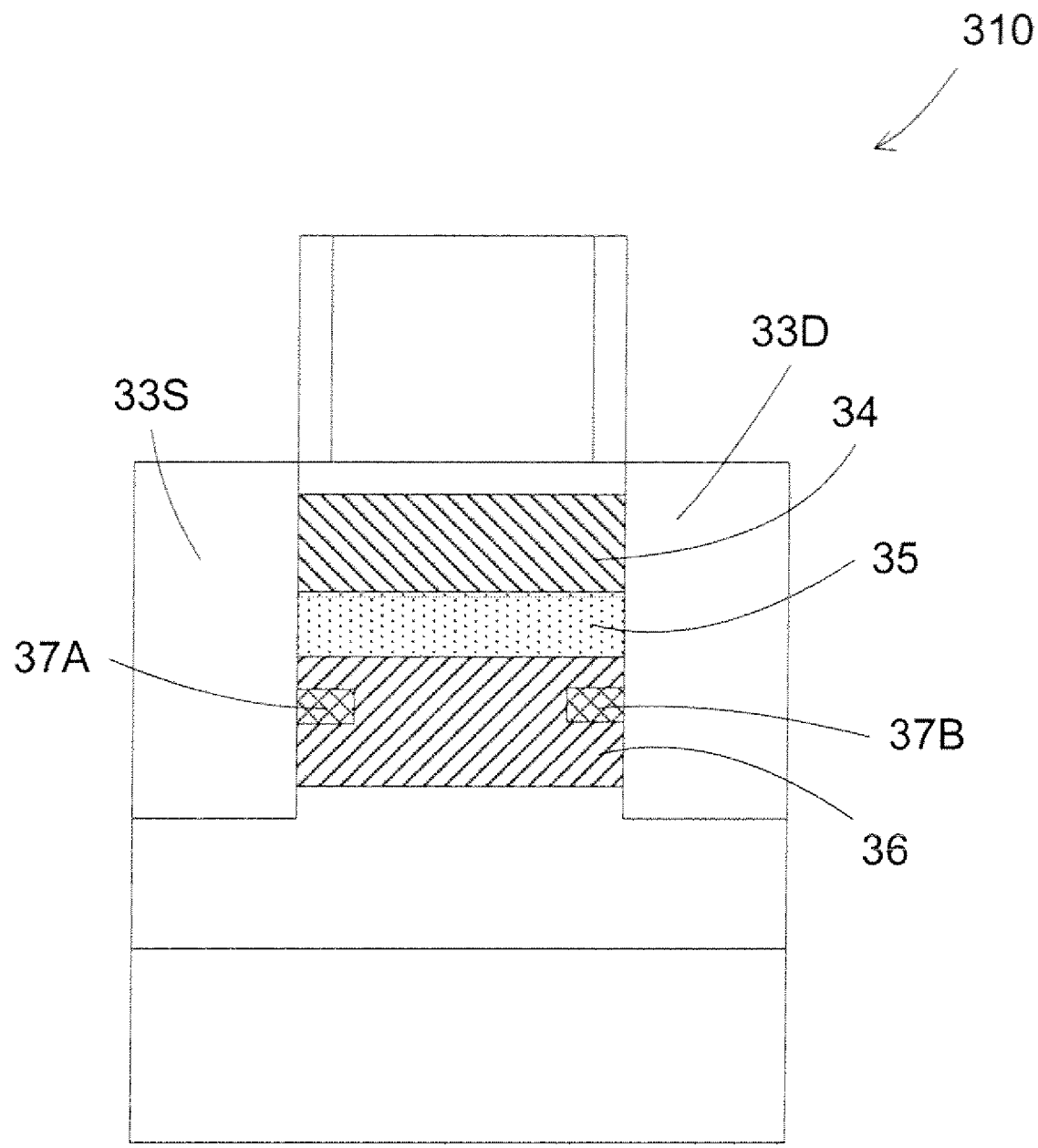
FIG. 8 illustrates another exemplary device in accordance with an embodiment of the present invention.

FIG. 8 illustrates another exemplary device in accordance with an embodiment of the present invention, showing a variation in device design. The remote counter doping regions 37A and 37B form pocket regions near the source 33S and the drain 33D within the bottom barrier layer 36. In an embodiment, the remote counter doping regions 37A and 37B can be fabricated by angled ion implantation.

Figure 9:
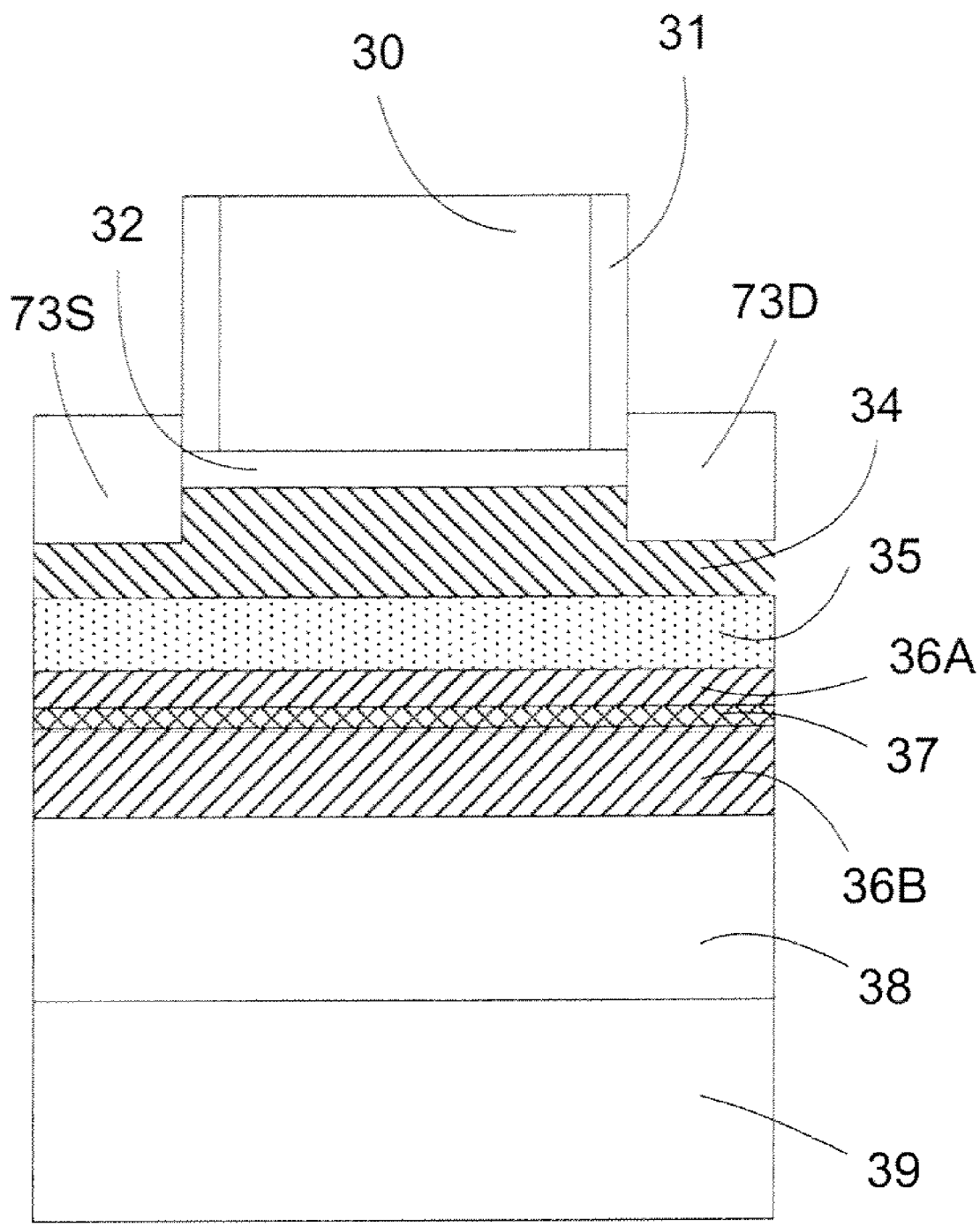
FIG. 9 illustrates another exemplary device in accordance with an embodiment of the present invention.

FIG. 9 illustrates another exemplary device in accordance with an embodiment of the present invention, showing another variation in device design. Source 73S and drain 73D are fabricated on the top barrier layer 34, conducting charge carriers through the quantum well channel 35. Thus the source 73S and drain 73D contact the top barrier layer 34 instead of the quantum well 35. This device may have different resistance from the source to the drain, since the current will need to travel through the top barrier layer 34 before passing through the quantum well channel 35.

Figure 10:
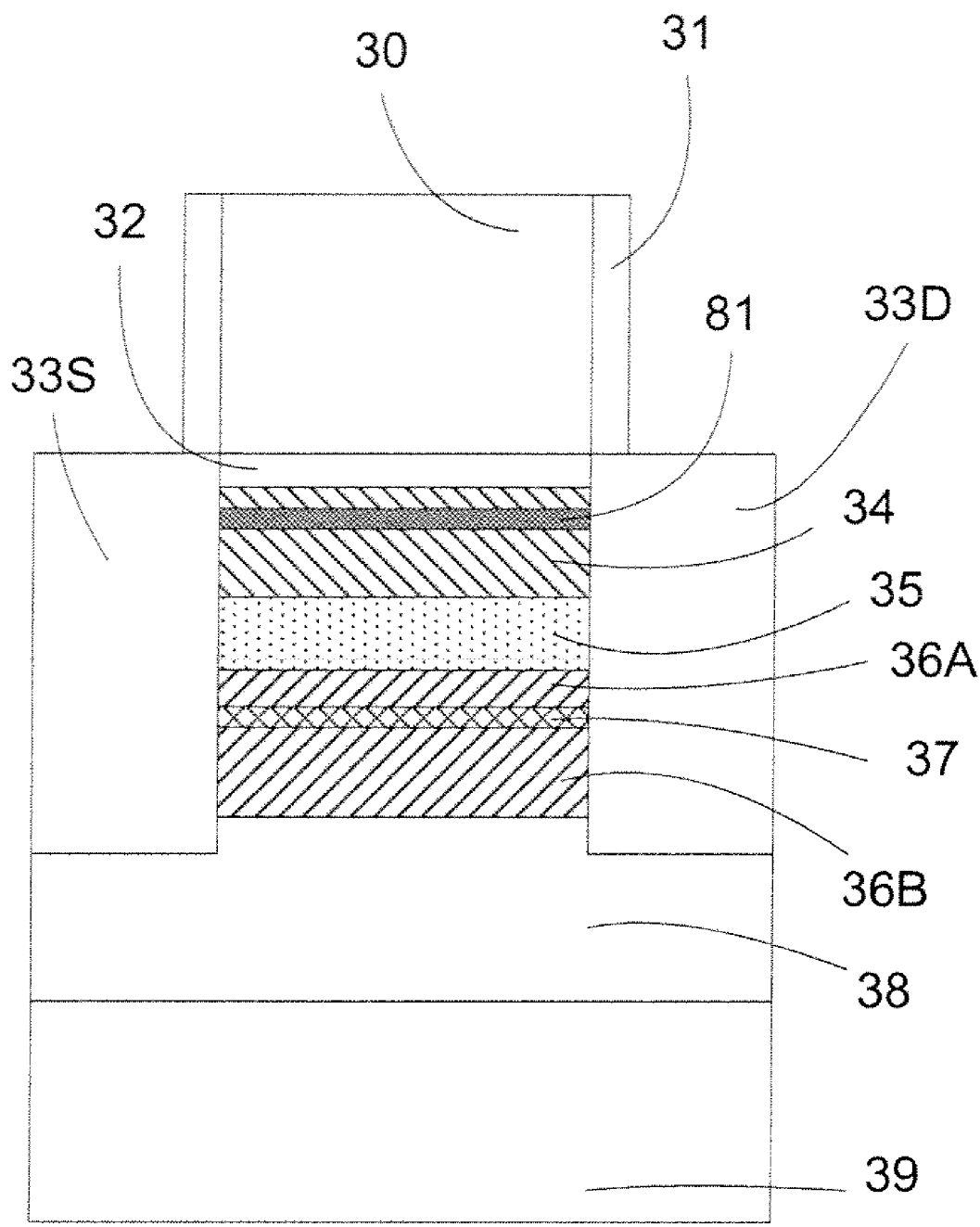
FIG. 10 illustrates an exemplary quantum well device with remote delta doping in accordance with an embodiment of the present invention.

FIG. 10 illustrates an exemplary quantum well device with remote delta doping in accordance with an embodiment of the present invention. A remote delta doping layer 81 is incorporated in the top barrier layer 34. The remote delta doping layer 81 comprises dopants of the same polarity as the conducting charges in the quantum well channel, and serves as a reservoir to inject charges to the channel. To achieve high mobility quantum well device structures, a key element is the ability to confine dopants in close proximity to the intrinsic quantum well. Such a requirement is not easily met in many cases due to the uncontrolled diffusivity of such dopants. The dopants in a highly doped barrier layer can diffuse into the quantum well during the subsequent growth and annealing steps and hence degrade the device mobility/performance. The advantages of using remotely doped quantum well structures rather than highly doped barrier layer include higher mobility due to reduced surface roughness and impurity scattering. Remote delta doping can overcome the charge depletion effect, and can give a higher electron density than that of uniformly doping in the barrier layers. This enhancement is due to the fact that uniformly distributed ions will screen the polarization field, while delta doping does not.

In an embodiment, the incorporation of remote delta doping can compensate for the reduction in conduction current during on-state. Alternatively, the remote delta doping can be uniformly doped, modulation doped and/or combinations thereof. In an embodiment, doping layer 81 may be a delta doped layer having a thickness of about 0.3-0.5 nm, and doping concentration less than $10^{20}/cm^3$. Similar to the remote counter doping layer 37, the remote delta doping layer 81 can be fabricated by deposition, grown, or ion implantation.

In an embodiment, the present invention discloses methods to fabricate quantum well structures and devices incorporating quantum well structures. In an embodiment, a method of fabricating a quantum well channel structure comprises forming a quantum well channel sandwiched between barrier layers of higher bandgap materials, and incorporating a remote counter doping in at least one of the barrier layers wherein the remote counter doping comprises dopant of opposite conductivity as compared to the conductivity of the charge carriers of the quantum well channel. In an embodiment, a method of fabricating a quantum well transistor comprises forming a source and drain comprising dopants of a first conductivity, forming a quantum well channel between the source and the drain, forming a gate in a vicinity of the quantum well for controlling the conduction of the quantum well channel, and forming a remote counter doping in a vicinity of the quantum well channel and comprising dopants of a second conductivity opposite the first conductivity.

Figure 11A:
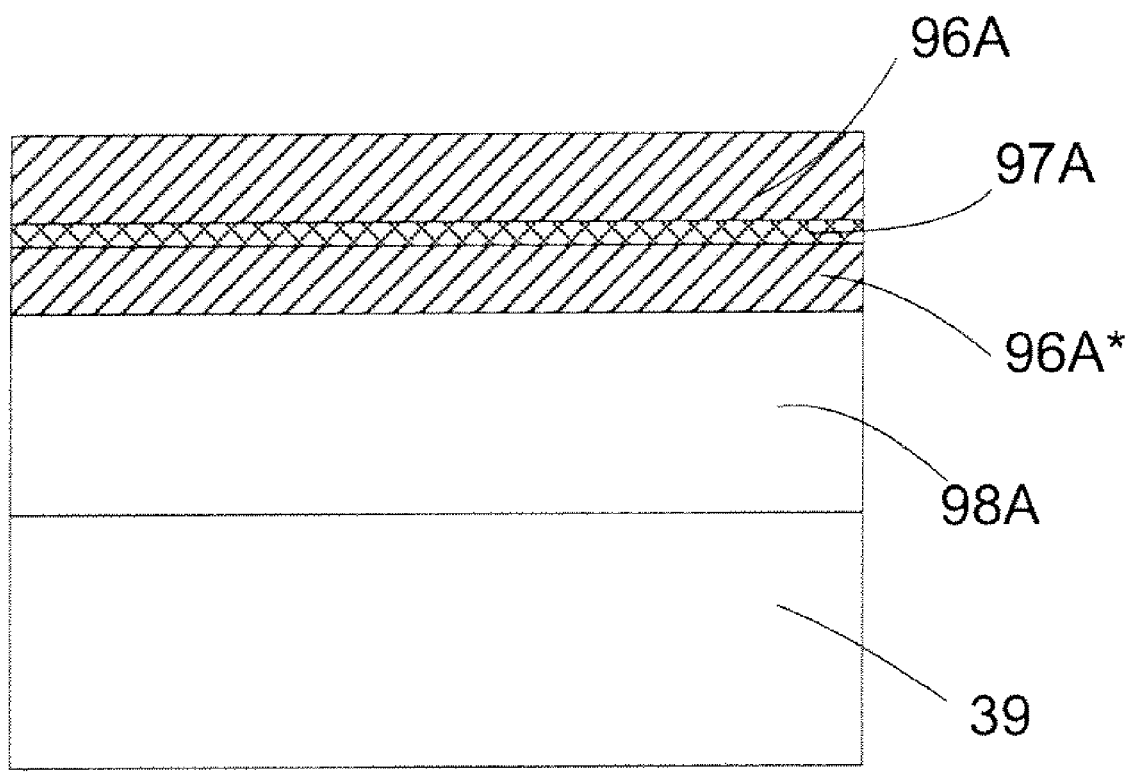
FIGS. 11A-11F illustrate an exemplary process flow to fabricate a quantum well device according to an embodiment of the present invention.

FIGS. 11A-11F illustrate an exemplary process flow to fabricate a quantum well device according to an embodiment of the present invention. In FIG. 11A, a substrate 39 is prepared. The substrate 39 can be a semiconductor substrate, or a semiconductor substrate bonded to a support substrate. On the substrate 39, buffer layer 98A is formed to accommodate the possible lattice constant mismatch between the substrate 39 and the quantum well channel, which is to be formed in subsequent steps. Single layer, multiple layers, or graded lattice buffer layer 98A can be used. Conditions of the buffer layer 98A, for example, its thickness, depend on the substrate and the quantum well materials. For example, if the substrate and the quantum well channel already have matching lattice, the buffer layer 98A might not be required, or can be very thin, such as the case of InGaAs quantum well channel fabricated on GaAs substrate.

In an embodiment, the substrate 39 is a silicon based substrate, such as silicon substrate, to take advantages of the silicon CMOS processing, and to integrate quantum well devices with conventional silicon CMOS devices. In this case, buffer layer 98A is advantageous to prepare the substrate for lattice matching. In embodiments of the present invention, the buffer layer 98A can be grown or deposited using an epitaxial deposition technique or a selective deposition/growth such as molecular beam epitaxy (MBE), metal-organic chemical vapor deposition (MOCVD), Metal-organic Vapor Phase Epitaxy (MOVPE) Low-Pressure Chemical Vapor Deposition (LPCVD), Ultra High Vacuum Chemical Vapor Deposition (UHV CVD) or Atmospheric Pressure Chemical Vapor Deposition (APCVD). Alternatively, the buffer layer 98A can also be formed by bonding with a support substrate.

A bottom barrier layer 96A is then formed on the buffer layer 98A. Barrier layer 96A is apart of the quantum well structure, comprising material having higher bandgap than that of the quantum well channel. The bottom layer 96A can be uniformly doped to provide carriers to the quantum well channel 95A An exemplary doping concentration of the bottom barrier layer 96A is less than $10^{20}/cm^3$. The doped barrier layer 96A can be formed by in-situ doped deposition, or by ion implantation. Further, barrier layer 96A can have diffusion barrier property to confine charges within the quantum well channel, in addition to the confinement imposed by the quantum well energy level. For III-V quantum well structures, the barrier layer 96A can be InP, InAlAs, InAlSb, InAlAsSb, InAlAsP and InGaAsP. The thickness of the barrier 96A can be less than 2-5 microns. In an embodiment, the bottom barrier layer 96A is an extension of the buffer layer 98A.

A remote counter doping layer 97A is form in the bottom barrier layer 96A, partitioning the bottom barrier layer 96A into 96A and 96A*. In an embodiment, the remote counter doping layer 97A can be formed by deposition, for example, by depositing a lower barrier layer 96A*, depositing a remote counter doping layer 97A, and then depositing an upper barrier layer 96A. In another embodiment, the remote counter doping layer 97A can be formed by ion implanting onto the barrier layer 96A. In an embodiment, the thickness of the remote counter doping layer is less 10 nm. In another embodiment, the thickness of the remote counter doping layer is less than 5 nm.

In embodiments of the present invention, the remote counter doping layer is incorporated in a vicinity of the quantum well channel, such as less than 10 nm or less than 5 nm from the quantum well channel. In an embodiment, the remote counter doping layer is disposed less 10 nm from the top of the bottom barrier layer 96A. In another embodiment, the remote counter doping layer is disposed less 5 nm from the top of the bottom barrier layer 96A.

In embodiments of the present invention, the concentration of the remote counter doping layer 97A is higher than $10^{16}/cm^3$ and less than $10^{18}/cm^3$. However, any doping concentration is within the scope of the present invention, which discloses a desire of performance improvements, for example, by reducing the off-state leakage current. For example, a doping concentration of $10^{15}/cm^3$ can be used for the remote counter doping layer in certain device designs. The dopants of the remote counter doping layer 97A have a conductivity opposite to that of the quantum well channel, for example, n type dopants for the remote counter doping layer 97A if the quantum well is a p-type channel, and vice versa.

Blanket or selective formation of the remote counter doping layer 97A can be prepared, depending on a fabrication scheme of the quantum well device. Selective formation can be accomplished by selective deposition, by masking before ion implantation, or by etch back after blanket formation.

Figure 11B:
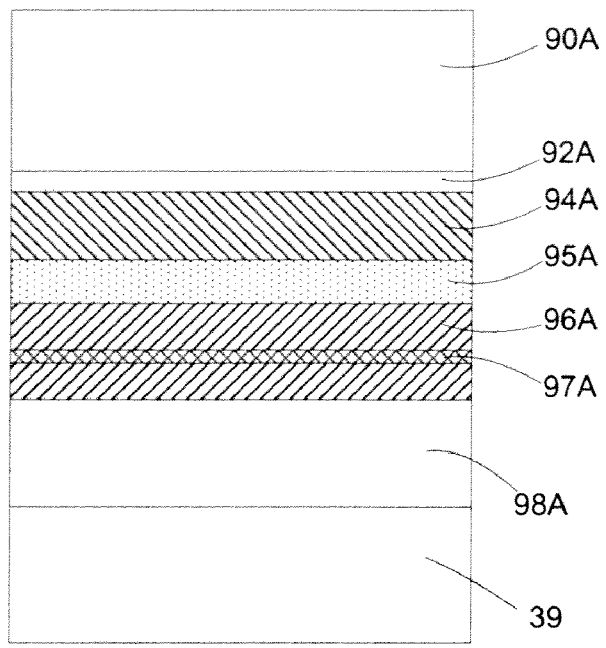

FIG. 11B shows the various layers of the quantum well device, including a quantum well channel layer 95A, a top barrier layer 94A, an optional gate dielectric layer 92A and a gate electrode 90A. These layers can be formed by any blanket or selective processing technique, including the techniques described above.

The quantum well channel 95A comprises a lower bandgap material as compared to the barrier layers 94A and 96A to confine the charges to the quantum well. III-V materials such as InSb and InGaAs are preferred due to their high mobility, but other materials, such as II-VII or IV materials, can also be used. The barrier layers 94A and 96A are typically selected to accommodate the quantum well channel 95A, for example, having higher bandgap and similar lattice constant. The thickness of the quantum well channel 95A depends on the quantum well device specifications, and is preferably more than 10 nm and less than 50 nm.

The top barrier layer 94A is formed on the quantum well channel 95A, and comprising a higher bandgap material, similar to the bottom barrier layer 96A. The top barrier material can be the same or different than the bottom barrier material. In an embodiment, the thickness of the top barrier layer 94A is thinner than that of the bottom barrier, for example, to allow the ease of control of the conduction channel by the gate electrode. In an embodiment, the top barrier layer 94A is thinner than 10 nm or thinner than 5 nm. Similar to the bottom barrier layer 96A, the top barrier layer 94A can be doped with similar concentration to provide carriers to the quantum well channel 95A.

In an embodiment, a remote delta doping layer can be incorporated in the top barrier layer 94A (not shown). The remote delta doping comprises dopants of the same conductivity as the charge carriers of the quantum well channel 95A, and acts as a carrier reservoir to supply additional carriers to the channel. The remote delta doping layer can improve the conduction current of the quantum channel, especially in the on-state.

The gate dielectric layer 92A is an optional layer. The top barrier layer 94A can be an insulator layer, and there might not have any need for an additional gate dielectric. Further, Schottky barrier can be implemented with a metal gate, eliminating the need for a gate dielectric. The gate electrode layer 90A is preferably a metal gate electrode, served to control the conduction current in the quantum well channel 95A. Conditions and parameters of the gate dielectric and the gate electrode layers depend on the device design, to implement optimum devices for an integrated circuit.

Figure 11C:
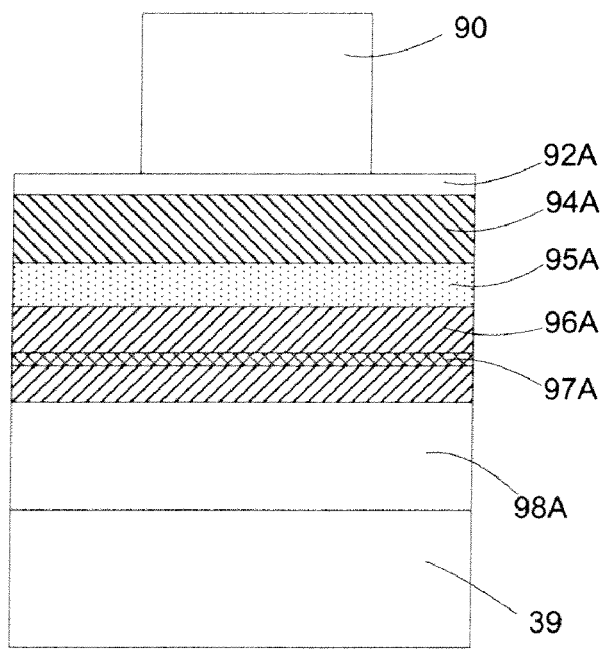

FIG. 11C shows a patterning process to form a gate electrode 90 from the gate electrode layer 90A. A patterning process, such as applying a lithography mask and etching the exposed portion of the mask, can be used to pattern the gate electrode 91. The etching process is preferably stopped before the gate electrode layer 92A.

Figure 11D:
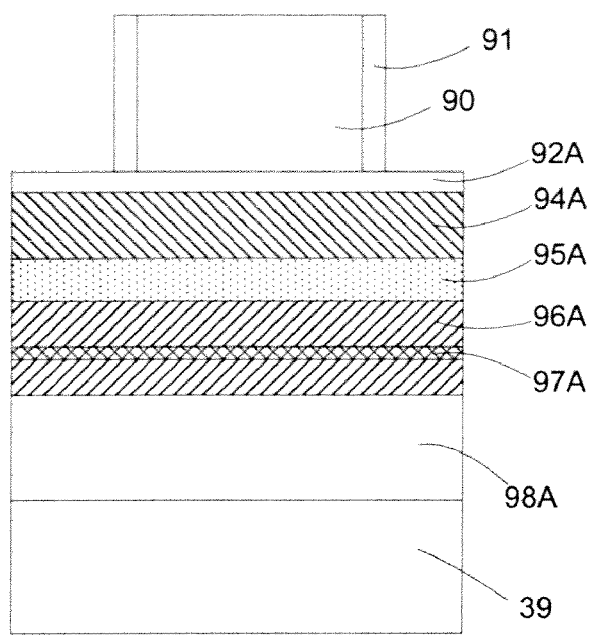

In FIG. 11D, spacers 91 are deposited, for example, to prevent shortage to the gate electrode 90.

Figure 11E:
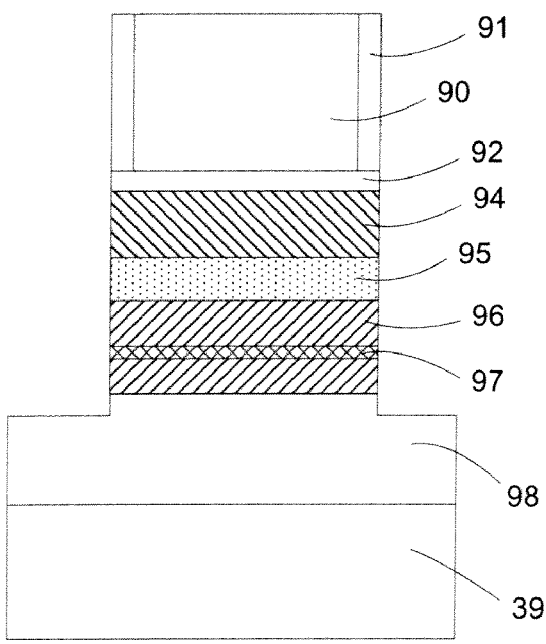

FIG. 11E shows another patterning process to pattern a source and drain. A masking and an etching processes can be used to etch the layers, stopped at the buffer layer 98. Alternatively, the etching process can stop at any other layer, such as the top barrier layer 94A, the quantum well layer 95A, or the bottom barrier layer 96A.

Figure 11F:
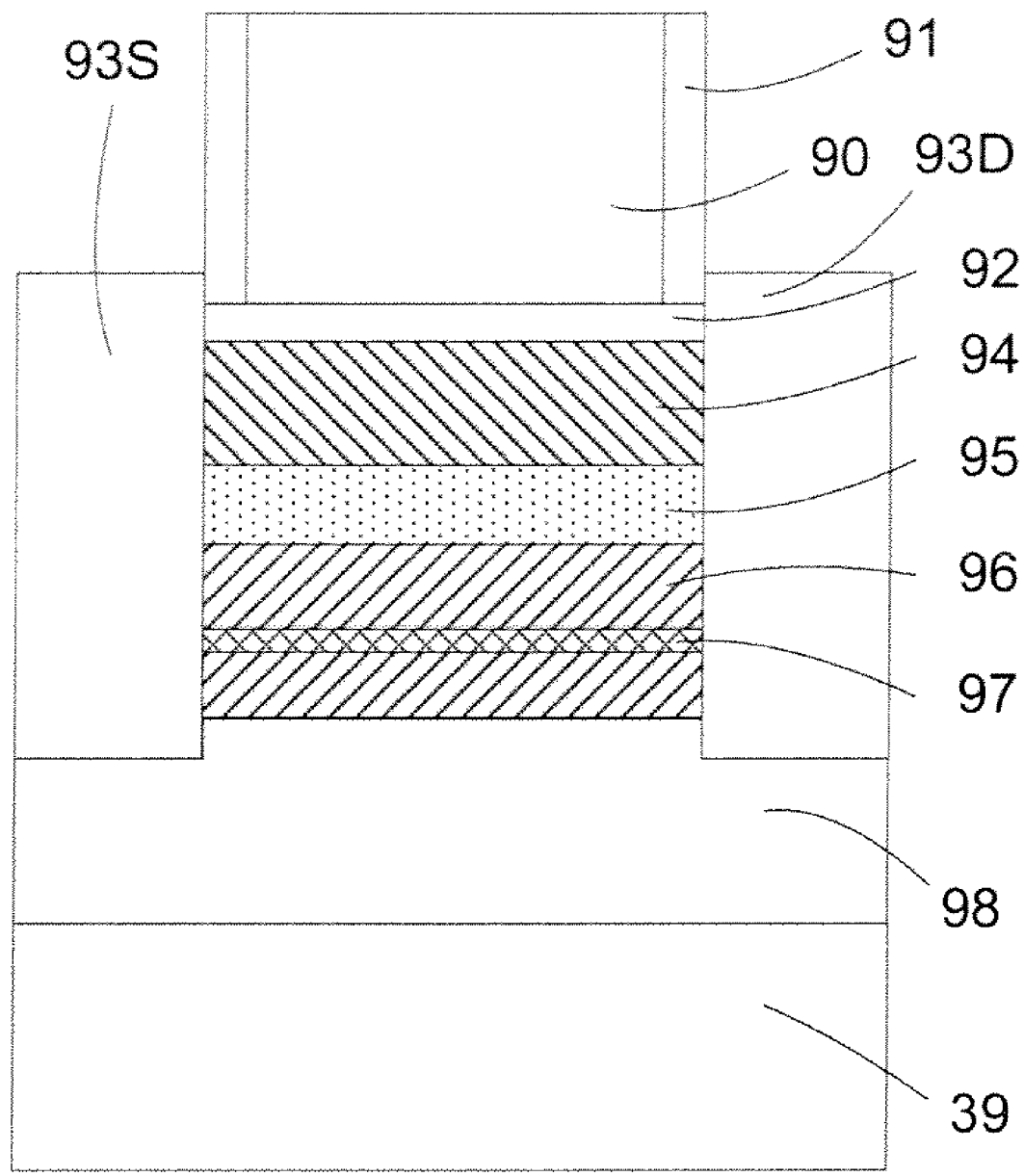

FIG. 11F shows the deposition of the source 93S and the drain 93D, sandwiching the quantum well structure comprising the optional gate dielectric 92, the top barrier 94, the quantum well channel 95, the bottom barrier 96, and the remote counter doping 97. Other device processing steps can be included, such as interconnection for the gate 90, for the source 93S, for the drain 93D, and the isolation pattern between devices.

In an embodiment, group III-V quantum well channel materials are preferred because these materials have well-established manufacturing and uses in commercial communications and optoelectronic products. For example, group III-V quantum well devices show an approximate 100-fold improvement in electron mobility, and an approximately 20-fold improvement n electron conductivity compared to silicon. Together, these improvements allow the design of logic devices having an improved combination of higher speed and lower power. In an embodiment, the fabrication of the present III-V quantum well devices is integrated onto a silicon substrate, further taking advantages of the manufacturability of silicon CMOS.

The above description illustrates an exemplary process flow according to an embodiment of the present invention.

There are many possible alterations and modifications of the above process flow, and thus it is to be understood that any particular embodiment shown and described by way of illustration is in no way intended to be considered limiting. For example, the fabrication of the source 93S and drain 93D is described by an etching and depositing process, but ion implantation can be performed to form the source and drain regions.

Figure 12:
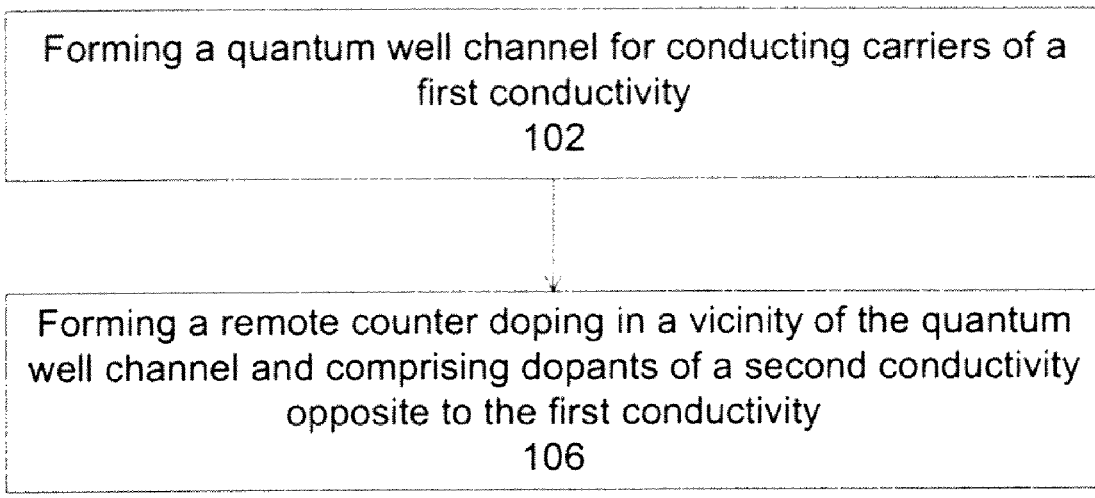
FIG. 12 illustrates an exemplary process to fabricate a quantum well structure according to an embodiment of the present invention.

FIG. 12 illustrates an exemplary process to fabricate a quantum well structure according to an embodiment of the present invention. Operation 102 forms a quantum well channel for conducting carriers of a first conductivity. The quantum well channel typically comprises a low bandgap material sandwiching between layers of higher bandgap material for an effective confinement of charge carriers within the quantum well channel. Operation 106 forms a remote counter doping in a vicinity of the quantum well channel and comprising dopants of a second conductivity opposite to the first conductivity. For example, if the quantum well channel is a p-channel quantum well channel, the dopants of the remote counter doping is n type donors. And if the quantum well channel is an n-channel quantum well channel, the dopants of the remote counter doping is n type acceptors.

Figure 13:
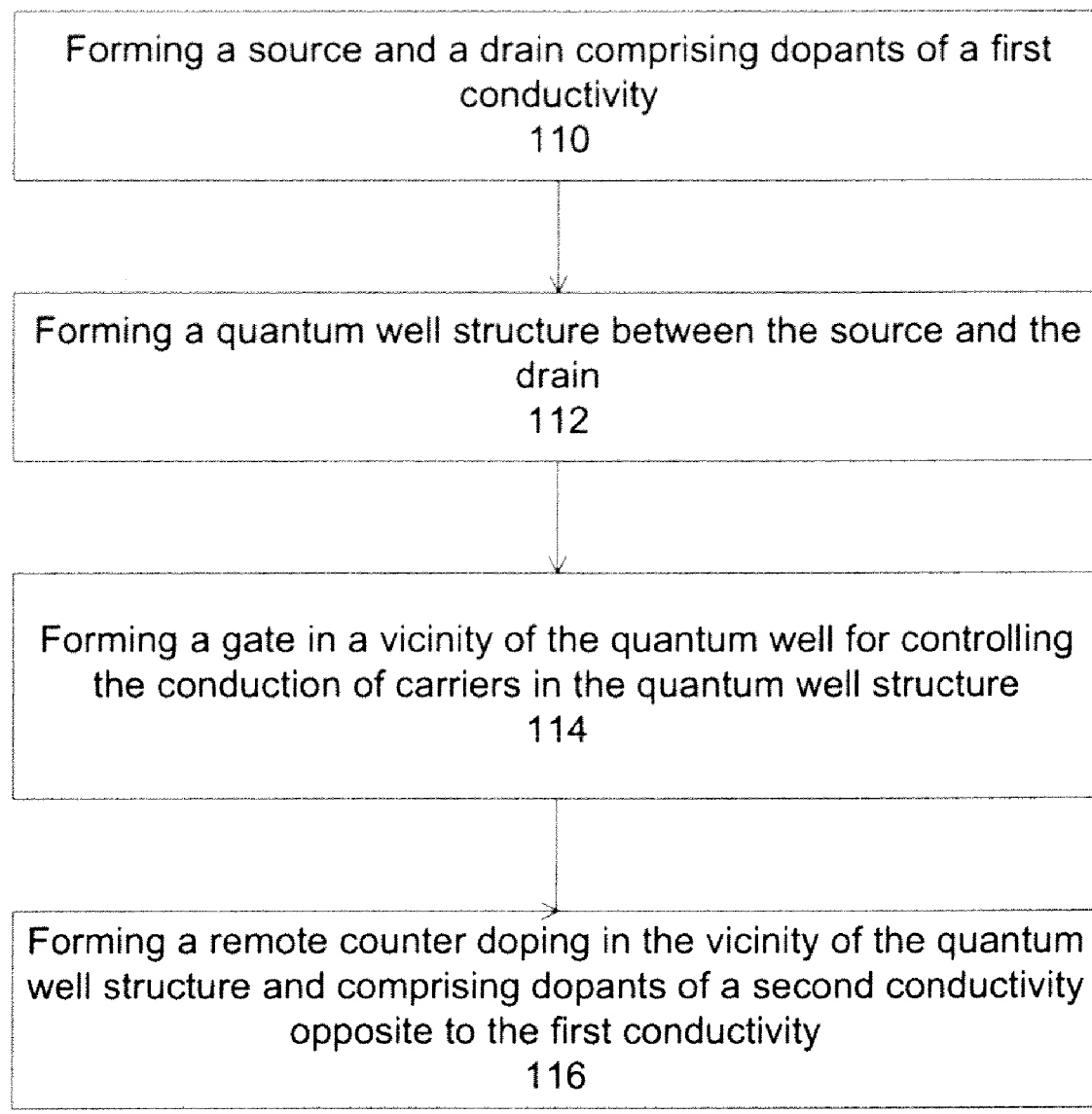
FIG. 13 illustrates an exemplary process of forming a device having a quantum well structure according to an embodiment of the present invention.

FIG. 13 illustrates an exemplary process of forming a device having a quantum well structure according to an embodiment of the present invention. Operation 110 forms a source and a drain comprising dopants of a first conductivity. Operation 112 forms a quantum well structure between the source and the drain. Operation 114 forms a gate in a vicinity of the quantum well structure for controlling the conduction of carriers in the quantum structure. Operation 116 forms a remote counter doping in a vicinity of the quantum well channel and comprising dopants of a second conductivity opposite to the first conductivity.

Figure 14:
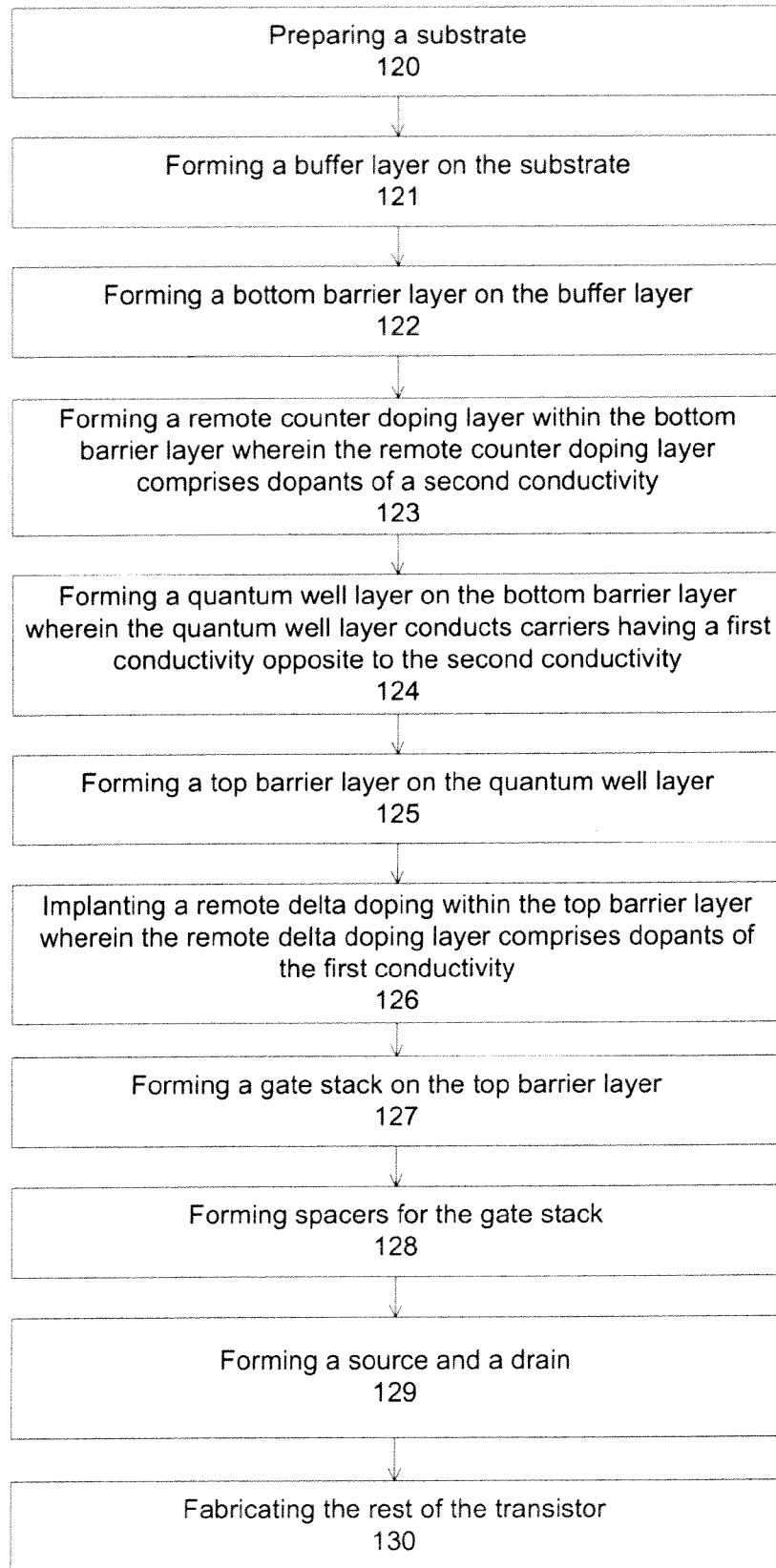
FIG. 14 illustrates another exemplary process of forming a device having a quantum well structure according to an embodiment of the present invention.

FIG. 14 illustrates another exemplary process of forming a device having a quantum well structure according to an embodiment of the present invention. Operation 120 prepares a substrate. Operation 121 forms a buffer layer on the substrate. Operation 122 forms a bottom barrier on the buffer layer. Operation 123 forming a remote counter doping layer within the bottom barrier layer wherein the remote counter doping layer comprises dopants of a second conductivity. In an embodiment, the remote counter doping layer is deposited on a lower bottom layer and an upper bottom layer is deposited on the remote counter doping layer. In another embodiment, ion implantation on the bottom barrier layer is performed to form the remote counter doping layer. Operation 124 forms a quantum well layer on the bottom barrier layer wherein the quantum well layer conducts carriers having a first conductivity opposite to the second conductivity. Operation 125 forms a top barrier layer on the quantum well layer. Operation 126 implants a remote delta layer within the top barrier layer, wherein the remote delta layer comprises dopants of the first conductivity. Operation 127 forms a gate stack on the top barrier layer. Operation 128 forms spacers for insulating the gate stack. Operation 129 forms a source and a drain comprising dopants of the first conductivity. Operation 130 forms the rest of the quantum well device.

While the present invent on has been described with respect to a limited number of embodiments, those skilled in the an will appreciate numerous modifications and variations therefrom. For example, the source and drain can comprise metal source and drain. It is intended that the appended claims cover all such modifications and variations as fall within the true spirit and scope of this present invention.

What is claimed is:

1. A quantum well structure comprising
   a narrow bandgap channel material sandwiched between layers of larger bandgap materials, the narrow bandgap channel for conducting charges of a first conductivity; and
   a remote counter doping incorporated in at least one of the layers of the larger bandgap materials, the remote counter doping comprising dopants of a second conductivity opposite the first conductivity, said remote counter doping for providing carriers of said second conductivity into said channel material.

2. A quantum well structure as in claim 1 wherein the quantum well channel materials comprise one of InSb, InGaAs, and InAs, and wherein the barrier layer materials comprise one of InAlSb, InP, InAlAs, and InGaAsP.

3. A quantum well structure as in claim 1 further comprising:
   a remote delta doping layer incorporated into at least one of the layers of the larger bandgap materials, the remote delta doping layer comprising dopants of the first conductivity and for serving as a charge reservoir for the quantum well channel.

4. A transistor comprising a quantum well structure as in claim 1.

5. A transistor comprising:
   a source and drain comprising dopants of a first conductivity;
   a quantum well channel for conducting charges of the first conductivity;
   a gate in a vicinity of the quantum well channel for controlling the conduction of the quantum well channel; and
   a remote counter doping in a vicinity of the quantum well channel and comprising dopants of a second conductivity opposite the first conductivity said remote counter doping for providing carriers of said second conductivity into said quantum well.

6. A transistor as in claim 5 wherein the remote counter doping controls a leakage current through the quantum well channel when the channel is not conducting.

7. A transistor as in claim 5 wherein the remote counter doping is incorporated less than 5 nm from the quantum well channel.

8. A transistor as in claim 5 wherein the quantum well channel comprises a narrow bandgap material sandwiched between layers of wider bandgap materials.

9. A transistor as in claim 8 wherein the remote counter doping comprises a doping region incorporated in at least one of the layers of larger bandgap materials.

10. A transistor as in claim 5 further comprising:
    barrier layers sandwiching the quantum well channel,
    wherein in barrier layers comprise materials of bandgap materials wider than the bandgap material of the quantum well channel, and
    wherein the remote counter doping is incorporated in at least one of the barrier layers.

11. A transistor as in claim 5 wherein the quantum well channel materials comprise one of InSb, InGaAs, and InAs and wherein the barrier layer materials comprise one of InAlSb, InP, InAlAs, and InGaAsP.

12. A transistor as in claim 5 further comprising:
    a buffer layer on a silicon-based substrate to support the transistor.

13. A transistor as in claim 5 further comprising:
    a remote delta doping layer in a vicinity of the quantum well channel, the remote delta doping layer comprising dopants of the first conductivity and for serving as a charge reservoir for the quantum well channel.

14. A transistor as in claim 5 wherein either:
the quantum well channel comprises a n-channel and the remote counter doping comprises p-type dopants; and
the quantum well channel comprises a p-channel and the remote counter doping comprises n-type dopants.

15. A method to fabricate a transistor, comprising:
forming a source and drain comprising dopants of a first conductivity;
forming a quantum well channel between the source and the drain;
forming a gate in a vicinity of the quantum well for controlling the conduction of the quantum well channel; and
forming a remote counter doping in a vicinity of the quantum well channel and comprising dopants of a second conductivity opposite the first conductivity, said remote counter doping for providing carriers of said second conductivity into said quantum well.

16. A method as in claim 15 wherein the remote counter doping is selected to reduce a leakage current through the quantum well channel when the channel is not conducting.

17. A method as in claim 15 further comprising:
forming barrier layers sandwiching the quantum well channel,
wherein in barrier layers comprise materials of bandgap materials wider than the bandgap material of the quantum well channel, and
wherein the remote counter doping is incorporated in at least one of the barrier layers.

18. A method as in claim 15 wherein the quantum well channel materials comprise one of InSb, InGaAs, and InAs and wherein the barrier layer materials comprise one of InAlSb, InP, InAlAs, and InGaAsP.

19. A method as in claim 15 further comprising:
forming a buffer layer on a silicon-based substrate before forming the quantum well channel.

20. A method as in claim 15 further comprising:
forming a remote delta doping layer in a vicinity of the quantum well channel, the remote delta doping layer comprising dopants of the first conductivity and for serving as a charge reservoir for the quantum well channel.

* * * * *

UNITED STATES PATENT AND TRADEMARK OFFICE
CERTIFICATE OF CORRECTION

PATENT NO. : 8,324,661 B2  
APPLICATION NO. : 12/646589  
DATED : December 4, 2012  
INVENTOR(S) : Marko Radosavljevic et al.

Page 1 of 1

It is certified that error appears in the above-identified patent and that said Letters Patent is hereby corrected as shown below:

In the Specifications:

In column 13, at line 61 delete, "invent" and insert -- invention --.

In column 13, at line 63 delete, "an" and insert -- art --.

Signed and Sealed this
Twenty-second Day of April, 2014

Michelle K. Lee
*Deputy Director of the United States Patent and Trademark Office*